United States Patent [19]

Wu

[11] Patent Number: 5,198,731
[45] Date of Patent: Mar. 30, 1993

[54] LINEARIZATION OF VERTICAL REFERENCE RAMP

[75] Inventor: Chun H. Wu, Singapore, Singapore

[73] Assignee: Thomson Consumer Electronics S.A., Paris, France

[21] Appl. No.: 898,271

[22] Filed: Jun. 15, 1992

[51] Int. Cl.[5] ..................... H01J 29/70; H01J 29/72
[52] U.S. Cl. ................... 315/388; 315/389
[58] Field of Search .................. 315/387, 388, 389

[56] References Cited

U.S. PATENT DOCUMENTS

| | | | |
|---|---|---|---|
| 3,735,192 | 5/1973 | Avery | 315/27 TD |
| 4,160,936 | 7/1979 | Monroe | 315/389 |
| 4,277,729 | 7/1981 | Rodgers | 315/398 |
| 4,810,940 | 3/1989 | Ogino et al. | 315/389 |
| 4,999,549 | 3/1991 | Wilber | 315/387 |

FOREIGN PATENT DOCUMENTS

| | | |
|---|---|---|
| 1201808 | 8/1970 | United Kingdom . |
| 1440098 | 6/1976 | United Kingdom . |
| 1475135 | 6/1977 | United Kingdom . |
| 1482553 | 8/1977 | United Kingdom . |
| 1489256 | 10/1977 | United Kingdom . |
| 1567541 | 5/1980 | United Kingdom . |

OTHER PUBLICATIONS

Mitsubishi Semiconductors Operation Manual p. 9. Single chip color television processor type M51408SP. Published in Japan, approximate publication date 1989.

Mitsubishi Semiconductors data sheet for M51408SP, pp. 1-2 and 2-2. Published in Japan Aug. 4, 1989.

*Primary Examiner*—Theodore M. Blum
*Attorney, Agent, or Firm*—Joseph S. Tripoli; Joseph J. Laks; Francis A. Davenport

[57] ABSTRACT

A vertical deflection ramp voltage is generated by the charge and discharge of a resistor capacitor combination. The voltage ramp is coupled to an amplifier which drives a current through a deflection coil producing a magnetic deflection field. The ramp voltage produced by the resistor capacitor combination has an inherent exponential shape which is linearized to prevent vertical linearity errors in the deflected electron beam. Linearization is achieved by multiple feedback paths which couple the amplifier output voltage and a voltage sample of the deflection coil current to the ramp forming resistor. These feedback signals are of a polarity such to establish a constant voltage across the resistor which consequently produces a constant current flow through the resistor. Hence with constant current flow in the resistor, a linear voltage ramp is produced across the capacitor and exponential deflection cramping is avoided. The voltage sample of the deflection coil current is coupled from the wiper of a potentiometer, which by other coupling produces degenerative feedback and provides control of deflection amplitude or height.

15 Claims, 2 Drawing Sheets

LINEARIZATION OF VERTICAL REFERENCE RAMP

This invention relates to the generation of a linearized reference ramp deflection signal for driving a vertical deflection coil.

BACKGROUND OF THE INVENTION

Vertical rate reference ramps may be generated by coupling a current source to a capacitor during the vertical trace time. The current source charges the capacitor developing a ramp or sawtooth voltage. The vertical sync pulse defines the start of vertical retrace and is used to discharge the voltage developed across the capacitor. At the end of the vertical sync pulse, the current source resumes charging the capacitor to produce a repetitive sawtooth waveform synchronized to the vertical sync pulse.

Vertical rate reference ramps may also be generated by coupling a voltage source to a capacitor during the vertical retrace interval. The voltage source charges the capacitor to the maximum voltage of the reference ramp, and then during vertical trace, the voltage source is decoupled from the capacitor and the capacitor is allowed to discharge through a resistor. The voltage across the capacitor decreases, thereby defining a ramp. This process is repeated at the vertical scanning rate, in synchronism with the vertical sync pulse.

The repetitive ramp or sawtooth reference signal is coupled to the vertical output amplifier which drives the vertical deflection winding. A sawtooth current is generated in the vertical deflection winding and the resultant magnetic field causes deflection of the electron beam within the cathode ray tube.

A reference ramp which is produced by discharging a capacitor through a resistor is not linear. The voltage across the capacitor decays exponentially according to the associated RC discharge time constant, i.e., the slope of the voltage waveform is progressively shallower over time. Although various deflection circuit parameters can be adjusted to reduce the effects of a nonlinear reference ramp, the exponential flattening in the reference ramp is undesirable since it will produce nonlinearity of displayed picture in the vertical direction.

The reference ramp signal from the ramp generator is coupled to a vertical output amplifier through a differential amplifier. A DC blocking capacitor may be coupled in series with the deflection winding and the output of the vertical output stage for producing an AC deflection current in the winding. The vertical output amplifier is essentially a voltage-to-current converter. The reference ramp signal is coupled to one input of the differential amplifier. Feedback paths couple the output of the output amplifier to both inputs of the differential amplifier for setting the gain of the output driver stage and for shaping the output signal. A negative DC feedback path determines the DC level of the output, and an AC negative feedback a signal developed from the voltage across a current sampling resistor coupled in series with the deflection coil provides control of the output level.

The output voltage of the output amplifier has components of a ramp voltage and a parabolic voltage. The ramp component is generated by the deflection current across the resistance of the winding and the resistance of the series connected current sampling resistor. The parabolic component is generated by integration of the deflection current by the DC blocking capacitor.

To provide S-shaping of the deflection current, the output voltage is integrated which results in the parabolic component being double integrated forming a third-order correction waveform. The integrated output voltage is then supplied to the non-inverting input of the differential amplifier for driving the output amplifier so as to generate an S-shaped deflection current.

SUMMARY OF THE INVENTION

A reference ramp generator with resistor which charges, or discharges a ramp generating capacitor inherently develops an exponentially shaped ramp, however with the inventive application of feedback a linear ramp may be developed.

In a deflection circuit a resistor and capacitor ramp generator is coupled to an amplifying means the output of which is coupled to a deflection coil to produce a deflection current. The deflection coil is AC coupled in series with a current sensor which produces a signal proportional to the coil current. Feedback from the deflection output is coupled to the resistor to linearize the inherent exponential ramp produced by the resistor capacitor combination.

In a further inventive embodiment two feedback paths are provided, one being coupled from the amplifier output, the second being coupled from the deflection coil current sensor.

The second feedback path is inventively coupled from the wiper of a potentiometer coupled in shunt with the deflection current sensing resistor.

This second feedback signal is also inventively coupled to the amplifier to produce variable, degenerative feedback control, of the deflection current amplitude, the potentiometer providing height adjustment.

DETAILED DESCRIPTION

Figure 1:
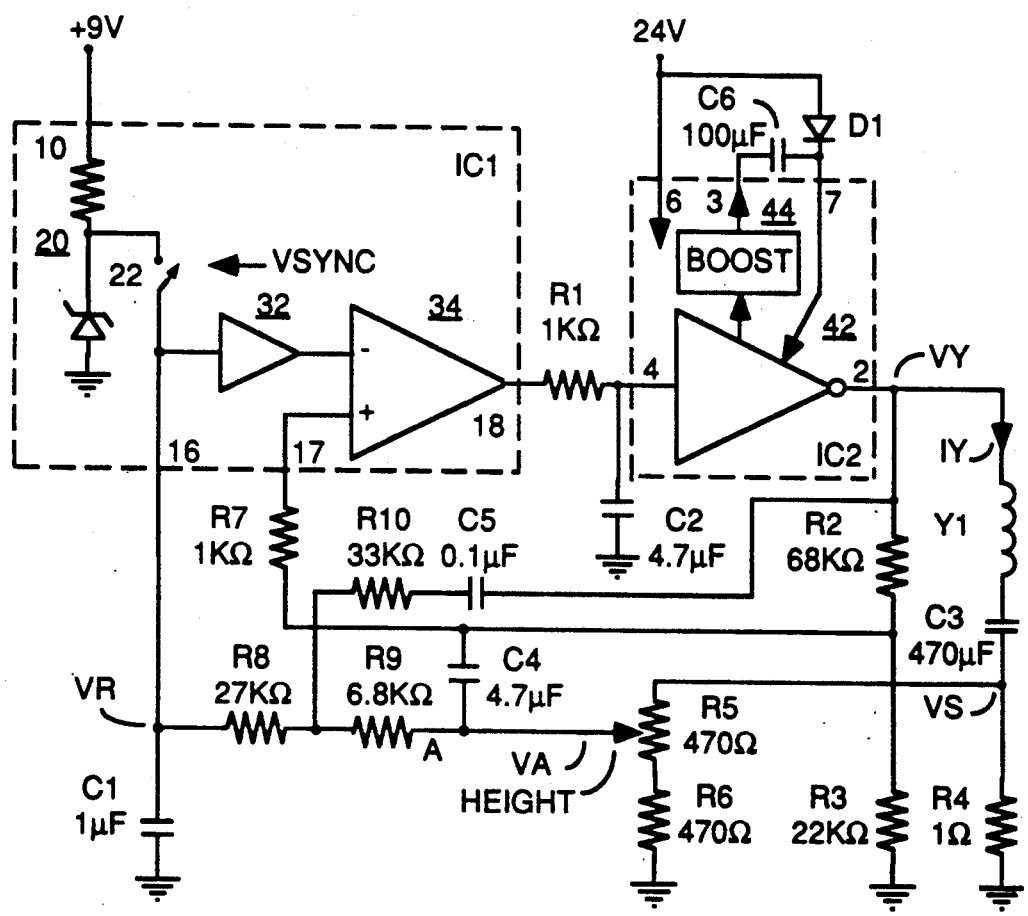
FIG. 1 is a schematic diagram illustrating a vertical deflection circuit with a linearized ramp generator according to the invention.

In the vertical deflection circuit of FIG. 1, a VSYNC pulse, generated from a sync separator, not shown, is applied to a switch 22. Switch 22 is activated by VSYNC and charges a capacitor C1, to a positive peak voltage VR, from a constant voltage source 20. During the trace interval, capacitor C1 is discharged in a manner to be further described to generate a downwardly sloping ramp portion of signal VR.

Ramp signal VR is coupled to an inverting input of a differential amplifier 34, through a noninverting buffer 32. The non-inverting input to amplifier 34 is coupled to certain feedback paths, discussed in detail hereafter. Voltage source 20, switching means 22, buffer 32 and differential amplifier 34 may be elements of a single integrated circuit, such as a type M52043SP, M51407SP or M51408SP, the appropriate pin numbers of which appear in the FIG. 1.

Figure 5:
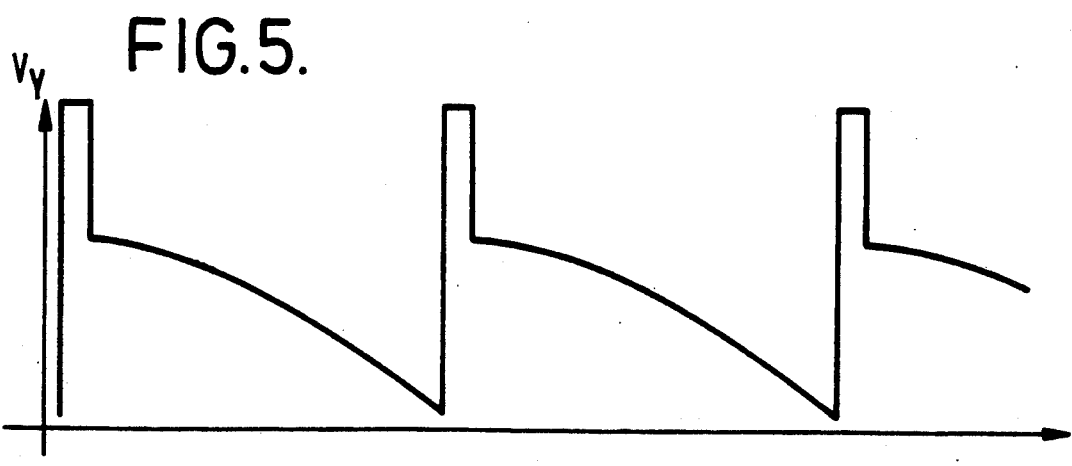

The output of differential amplifier 34 at pin 18 of IC1 is coupled through a high frequency roll off network formed by series resistor R1 and a capacitor C2 to ground, which reduce the undesirable effects of noise or higher frequency signals from being coupled to a vertical output amplifier 42. Vertical amplifier 42 may be considered as an inverting voltage-to-current-converter, providing output current for driving a vertical deflection winding Y1. Waveform VSYNC determines the start of vertical flyback which requires the rapid retrace of the deflected electron beam. Vertical flyback requires that the deflection current in the deflection coils be reversed, from a negative peak to a positive peak. To achieve a rapid retrace, the supply voltage to the output stage is increased during the retrace period, to a higher or boost supply voltage, generated by a pump-up circuit 44. The boost voltage is generated in conjunction with a capacitor C6 and a diode D1, and provides a positive voltage pulse which is added to the supply voltage effectively doubling the voltage supplied to the output stage. FIG. 5 shows the effect of the increase in supply voltage in the output waveform of amplifier 42. The output amplifier and boost circuit can be provided on a common integrated circuit IC2, such as a type LA7830, the appropriate pin numbers of which are shown in the drawing.

Figure 2:
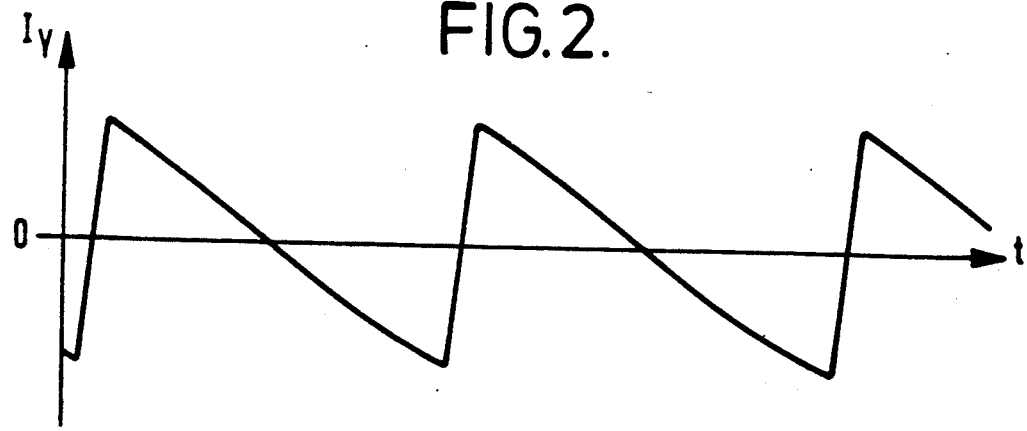
FIGS. 2-5 illustrate waveforms at various points in FIG. 1.

The output of amplifier 42, drives vertical deflection winding Y1 which is coupled in series with a DC blocking capacitor C3 and a current sensing resistor R4. FIG. 2 depicts the voltage VS developed across current sensing resistor R4 by the deflection current IY in yoke Y1. The rapid retrace period is shown by a fast rise from a maximum negative value to a maximum positive value. FIG. 5 shows the voltage VY at the output of amplifier 42. The voltage VY shows a positive pulse, occurring at the retrace time, which achieves the rapid reversal of deflection coil current. The voltage VY also depicts a ramp component generated by the deflection current in the resistive elements of winding Y1 and resistor R4, and a parabolic component generated by the integration of the deflection current by DC blocking capacitor C3.

The voltage signal VY at the output of output amplifier 42 is fed back to the non-inverting input of differential amplifier 34 via a DC feedback path. The output of amplifier 42, is coupled to a voltage divider formed by resistors R2 and R3, the junction of which sets the DC level of the signal fed back, via a series resistor R7, to the non-inverting input of differential amplifier 34. In view of the gain of the driver and amplifier stages, differential amplifier 34 will tend to drive the output through output amplifier 42 so as to maintain a DC voltage level that is equal to the DC level established at the reference ramp input of the differential amplifier. The current sense signal VS is also fed back from a voltage divider comprising potentiometer R5 and resistor R6, to the non-inverting input of differential amplifier 34, via a capacitor C4 and resistor R7 connected in series. Potentiometer R5 adjusts vertical deflection amplitude, or raster height. The current sense signal is compared against the reference ramp at the inverting input, which due to the action of feed back loop results in an opposing current flow in the deflection coil which linearizes the vertical scanning waveform to the reference ramp waveform.

To provide S-shaping or third order correction, the deflection coil current signal VS, is integrated by capacitor C4. Since voltage signal VS contains a parabolic waveform component, due to capacitor C3, the additional integration by capacitor C4 provides the required third order correction signal. Capacitor C4 is coupled to the non-inverting input of differential amplifier 34 via resistor R7. Hence, by introducing a third order correction waveform into the feed back path, the differential amplifier will attempt to eliminate this third order component with the result that an opposing third order correction current will be caused to flow through the deflection coil Y1 resulting in the desired S correction.

To generate the reference ramp voltage VR, ramp capacitor C1 is discharged via resistors R8 and R9 connected in series plus a series parallel combination of R4, R5 and R6. However, discharging the ramp capacitor C1 to ground through a resistor will produce an exponential ramp voltage that will result in vertical non-linearity of the displayed image. To avoid vertical non-linearity a linear ramp is required, which in turn requires a linear discharge of capacitor C1. To linearize the exponentially shaped discharge ramp, the output voltage signal VY of output amplifier 42 is AC coupled via a capacitor C5 and a resistor R10 to the junction of series connected resistors R8 and R9. Resistor R10 forms a voltage divider with the combination of resistors R9, R4, R5, and R6.

Since the output of amplifier 42 has components of a ramp and a parabola, and is AC coupled to the ramp capacitor, the downwardly curving output voltage shown by FIG. 5, tends to partially offset the exponential curve of an RC discharge, to render the ramp more linear.

However, relying on such an approach for total ramp waveform correction has several disadvantages. The amplitude of the parabolic component of output voltage VY which contributes to the correction waveform, relative to the ramp component of voltage VY, must be optimized to provide correct S-shaping. This optimization may not be the best for reference ramp waveform correction purposes.

Additionally, the amplitude of the ramp component of output voltage VY increases over a period of time from turn-on of the television receiver. This variation is due to heating of the vertical deflection winding with the resultant increase in resistance of the winding wire. In addition, manufacturing tolerance variations between windings of different deflection units may introduce a further impedance variation with a resulting variation in output voltage VY. Thus complete reliance on output voltage (VY) feedback to provide reference ramp waveform correction, will result in correction inaccuracies.

In accordance with an inventive feature, a second source of downwardly ramping voltage is coupled to discharge resistor R8 to compensate for the tendency of the reference ramp VR to depart from a linear ramp. Advantageously, this source is the current sense voltage developed across sampling resistor R4.

In carrying out the invention, a terminal A of a resistor R9 that is remote from discharge resistor R8 is coupled to current sense voltage VS via the wiper of potentiometer R5. The voltage at terminal A is thus made lower over time, during the trace interval. The tendency of the flattening of the voltage VR at the ramp capacitor to flatten at the end of trace is therefore overcome by addition of the ramp signal from current sense resistor R4. This results in the voltage across resistor R8 being maintained relatively constant, even towards the end of trace. Thus a constant voltage applied across resistor R8 will result in a constant current flow from capacitor C1 thereby producing a linear reference ramp waveform. The respective resistors, R8–R10 are balanced to adjust the linearity of the reference ramp using these plural feedback paths and plural sources of feedback signals.

Figure 3:
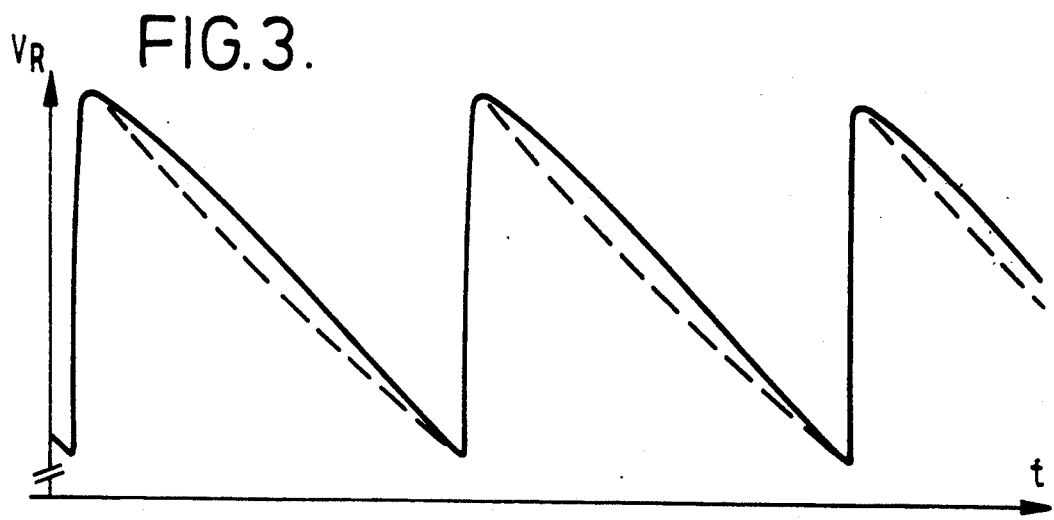
Figure 4:
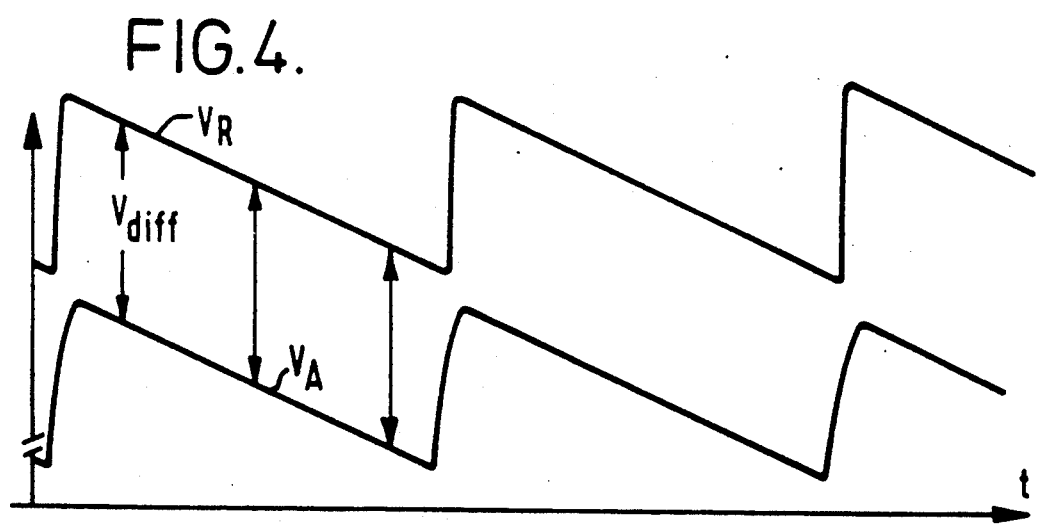

FIG. 3 illustrates the extent of linearity correction which is achieved by coupling the current sense signal VS to terminal A of resistor R9 (solid line waveform) as compared to grounding that terminal (dashed line waveform). This may be qualitatively understood by inspection of FIG. 4, where the voltage VR on capacitor C1 is compared to the voltage VA at the wiper of potentiometer R5. The difference between these two voltages, Vdiff, is relatively constant, producing the desired relatively constant current through resistors R8 and R9. For this qualitative understanding, the effects of output voltage feedback via resistor R10 have not been taken into account.

Alternatively explained, by coupling the downwardly ramping current sense voltage VS to the same input terminal of differential amplifier 34 that the downwardly ramping reference ramp voltage VR is coupled, positive feedback is introduced which tends to accelerate the discharge of capacitor C1. This compensates for the tendency of capacitor C1 to discharge more slowly toward the end of vertical trace.

In carrying out the invention, discharge resistor R9 is coupled to the wiper of height adjusting potentiometer R5 which results in a more constant amplitude signal applied across resistor R8. A function of height adjustment is to compensate for variations in deflection sensitivity between different deflection coils. Thus adjustment of the height potentiometer produces a wiper voltage VA which, due to negative feedback via resistor R7, varies in a sense opposite that of the change in current sense voltage VS. This advantageously reduces the net variation in the amount of correction supplied to reference ramp capacitor C1 via resistor R9.

What is claimed is:

1. A deflection circuit, comprising:
   a deflection coil;
   an amplifier having an output coupled to the deflection coil for producing a current therein, and having an input coupled to said output to provide degenerative feedback;
   a ramp generator coupled to an input of the amplifier and comprising;
   a capacitor for producing a ramp voltage by repetitive charge and discharge;
   a resistor coupled to said capacitor for providing charge conduction which subjects the ramp voltage to exponential variation;
   a source of current operable to provide capacitor charge;
   switching means coupled to said capacitor for generating said repetitive charge and discharge of said capacitor;
   current sensing means coupled to said deflection coil for producing a current sense signal in accordance with said deflection coil current;
   means for coupling said amplifier output to said resistor for linearizing exponential variation of said ramp voltage; and
   means coupled to said resistor and responsive to said current sense signal for further linearizing the exponential variation of said ramp voltage.

2. The deflection circuit according to claim 1, wherein the output of the amplifier is a voltage signal, AC coupled with a polarity and amplitude which tends to produce a constant voltage across said resistor.

3. The deflection circuit according to claim 1, wherein said current sense signal is an AC voltage being coupled to provide additional voltage constancy across said resistor.

4. The deflection circuit according to claim 1, wherein said switching means is operable to generate said repetitive charge and discharge of said capacitor responsive to a vertical sync signal coupled thereto.

5. The deflection circuit according to claim 1, wherein said amplifier comprises a differential amplifier having a first input coupled to the ramp voltage and a second input coupled to provide said degenerative feedback.

6. The deflection circuit according to claim 5, wherein said the degenerative feedback comprises a first component DC coupled from said output and a second component AC coupled from said current sensing means.

7. The deflection circuit according to claim 6, wherein said second component comprises a potentionmeter coupled to said current sense signal to provide control of deflection current amplitude.

8. The deflection circuit according to claim 6, wherein said second component includes an integration capacitor operative to integrate said current sense signal to provide a third order correction signal.

9. The deflection circuit according to claim 1, wherein the amplifier output is coupled to a series combination of, said deflection coil, a DC blocking capacitor and a sensing resistor, said sensing resistor providing said current sense signal proportional to said deflection coil current.

10. The deflection circuit according to claim 9, wherein the amplifier further comprises a boost circuit coupled thereto for increasing an output signal of the amplifier to a maximum during retrace.

11. A deflection circuit, comprising:
    a deflection coil;
    an amplifier having an output AC coupled with a series combination of a capacitor, a current sense resistor and the deflection coil for producing a scanning current therein;
    a ramp capacitor coupled to an input of said amplifier for producing a ramp voltage by repetitive charge and discharge;
    a ramp resistor coupled to said ramp capacitor for providing charge conduction which subjects the ramp voltage to exponential variation;
    a source of current operable to provide ramp capacitor charge;
    switching means coupled to said ramp capacitor for generating said repetitive charge and discharge of said ramp capacitor; and
    a variable resistor coupled in shunt with said sense resistor, the variable resistor having a wiper coupled to said ramp resistor to linearize the exponential variation of the ramp voltage of said ramp capacitor, said wiper being further coupled to an input of said amplifier for providing variable degenerative control of deflection amplitude.

12. The deflection circuit according to claim 11, including means for AC coupling said amplifier output to the ramp resistor to linearize the ramp voltage.

13. The deflection circuit according to claim 11, wherein said amplifier output is DC coupled to the amplifier input to provide degenerative control of a DC voltage at said amplifier output.

14. The deflection circuit according to claim 11, wherein said amplifier further comprises a boost circuit coupled thereto for increasing an output signal of the amplifier to a maximum during retrace.

15. The deflection circuit according to claim 11, wherein said switching means is coupled to a vertical sync signal for synchronizing said repetitive charge and discharge of said ramp capacitor.

* * * * *